United States Patent [19]
Gardner et al.

[11] Patent Number: 6,150,222
[45] Date of Patent: Nov. 21, 2000

[54] METHOD OF MAKING A HIGH PERFORMANCE TRANSISTOR WITH ELEVATED SPACER FORMATION AND SELF-ALIGNED CHANNEL REGIONS

[75] Inventors: Mark I. Gardner, Cedar Creek; Thien T. Nguyen, Austin, both of Tex.; Charles E. May, Gresham, Oreg.

[73] Assignee: Advanced Micro Devices, Inc., Austin, Tex.

[21] Appl. No.: 09/226,231

[22] Filed: Jan. 7, 1999

[51] Int. Cl.[7] .................................................. H01L 21/336
[52] U.S. Cl. .......................... 438/300; 438/301; 438/303
[58] Field of Search .................................... 438/275, 277, 438/301, 303, 305, 300

[56] References Cited

U.S. PATENT DOCUMENTS

| | | | |
|---|---|---|---|
| 5,447,875 | 9/1995 | Moslehi | 437/41 |
| 5,792,697 | 8/1998 | Wen | 438/275 |
| 5,950,089 | 9/1999 | Wen | 438/275 |

*Primary Examiner*—John F. Niebling
*Assistant Examiner*—Walter L. Lindsay, Jr.

*Attorney, Agent, or Firm*—Williams, Morgan & Amerson, P.C.

[57] ABSTRACT

The present invention is directed to a transistor formed above a layer of a dielectric material and a method of making same. In one illustrative embodiment, the method comprises forming a first layer of dielectric material, forming a plurality of source/drain regions comprised of polysilicon above said first layer of dielectric material and between said source/drain regions, and forming a second layer of dielectric material above said first layer of dielectric material. The method further comprises forming a layer of polysilicon above the second layer of dielectric material, forming a gate dielectric above said layer of polysilicon, and forming a gate conductor above said gate dielectric. The transistor structure is comprised of a first layer of dielectric material, a plurality of source/drain regions positioned above the first layer of dielectric material, a second layer of dielectric material positioned above the first layer of dielectric material, and a layer of polysilicon positioned above the second layer of dielectric material and between said source/drain regions. The structure further comprises a gate dielectric positioned above the layer of polysilicon and a gate conductor positioned above the gate dielectric.

39 Claims, 4 Drawing Sheets

METHOD OF MAKING A HIGH PERFORMANCE TRANSISTOR WITH ELEVATED SPACER FORMATION AND SELF-ALIGNED CHANNEL REGIONS

BACKGROUND OF THE INVENTION

1. Field of the Invention

The present invention is generally directed to the field of semiconductor processing, and, more particularly, to a method of making a high performance transistor.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor, e.g., channel length, junction depths, gate dielectric thickness, etc., are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Reducing the channel length of a transistor also requires that the depth of the source and drain regions adjacent the gate conductor be reduced. As source/drain junctions get shallower, the punch-through implant also gets shallower. As a result, the shallower punch-through implant tends to invade the region of the threshold voltage implant, i.e., the concentration of, for example, boron, tends to be larger at the surface of the silicon. The increase in the concentration of the punch-through implant also tends to increase the threshold voltage of the transistor. Increases in the threshold voltage of a transistor are undesirable for a number of reasons. For example, an increase in the threshold voltage tends to make the transistor harder to turn "ON" and may also result in the reduction of the drive current of the device.

The present invention is directed to a semiconductor device that minimizes or reduces some or all of the aforementioned problems and a method of making same.

SUMMARY OF THE INVENTION

The present invention is generally directed to a high performance transistor and a method of making same. The method comprises forming a first layer of dielectric material, forming a first layer of polysilicon above the first layer of dielectric material, and patterning the first layer of polysilicon to define a plurality of source/drain regions. The method further comprises forming a second layer of dielectric material at least above the first layer of dielectric material, forming a second layer of polysilicon at least between said source/drain regions and above the second layer of dielectric material, forming a gate dielectric above the second layer of polysilicon, and forming a gate conductor above the gate dielectric.

The transistor structure of the present invention is comprised of a first layer of dielectric material, a plurality of source/drain regions positioned above the first layer of dielectric material, a second layer of dielectric material positioned above the first layer of dielectric material, and a layer of polysilicon positioned between the source/drain regions and above the second layer of dielectric material. The transistor further comprises a gate dielectric positioned above the layer of polysilicon and a gate conductor positioned above the gate dielectric.

BRIEF DESCRIPTION OF THE DRAWINGS

The invention may be understood by reference to the following description taken in conjunction with the accompanying drawings, in which like reference numerals identify like elements, and in which.

Figure 1:
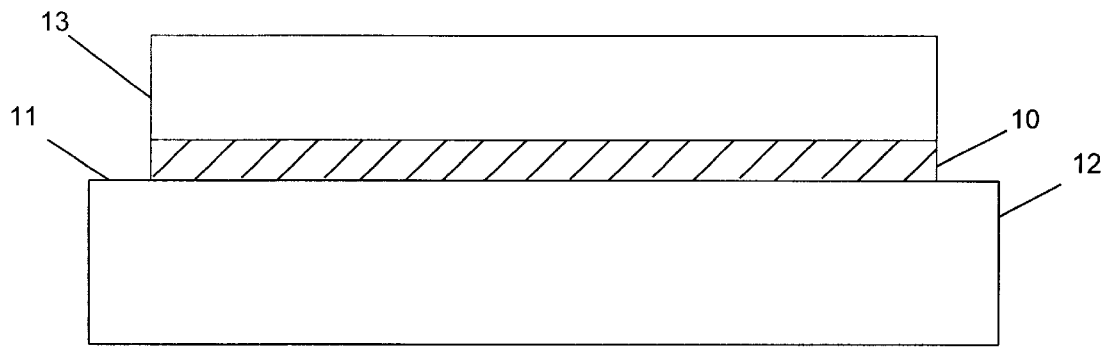
FIG. 1 is a cross-sectional view of a plurality of process layers formed above an illustrative semiconducting substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–8. Although the various regions and structures of a semiconductor device are depicted in the drawings as having very precise and sharp configurations and profiles, those skilled in the art recognize that, in reality, these regions and structures are not as precise as indicated in the drawings.

Additionally, the relative sizes of the various features depicted in the drawings may be exaggerated or reduced as compared to the size of those feature sizes on fabricated devices. Nevertheless, the attached drawings are included to describe and explain illustrative examples of the present invention. As will be readily apparent to those skilled in the art upon a complete reading of the present application, the present invention is applicable to a variety of technologies, e.g., NMOS, PMOS, CMOS, etc., and is readily applicable to a variety of devices, including, but not limited to, logic devices, memory devices, etc.

As shown in FIG. 1, a dielectric layer 10 is formed above a surface 11 of a structure 12, and a polysilicon layer 13 is formed above the dielectric layer 10. The structure 12 may be comprised of a semiconducting substrate, such as silicon. However, the present invention is not limited to the formation of a transistor above a surface of a semiconducting substrate. Rather, as will be apparent to one skilled in the art upon a complete reading of the present disclosure, a transistor formed in accordance with the present invention may be formed above previously formed semiconductor devices, e.g., transistors, or other similar structure. In effect, the present invention may be used to form transistors on top of previously formed transistors. Thus, the structure 12 may be comprised of any previously existing structure.

The dielectric layer 10 may be formed by a variety of known techniques and may be comprised of a variety of different materials. By way of example only, the dielectric layer 10 may be comprised of a nitrogen-bearing silicon dioxide, silicon dioxide, silicon nitride, silicon oxynitride, etc. In general, the dielectric layer 10 may be comprised of dielectric materials having a dielectric constant ("K") of less than approximately eight. The dielectric layer 10 may have a thickness ranging from approximately 2000–5000 Å, and it may be formed by a variety of known techniques, including, but not limited to, thermal growing, chemical vapor deposition (CVD), sputtering, low pressure chemical vapor deposition (LPCVD), etc. In one illustrative embodiment, the dielectric layer 10 may be comprised of silicon dioxide having a thickness of approximately 1000 Å that is formed by a CVD process. The polysilicon layer 13 may be formed by a variety of known techniques for forming such layers, e.g., CVD, LPCVD, and may have a thickness ranging from approximately 100–2000 Å. Eventually, as described more fully below, portions of the polysilicon layer 13 will become the source/drain regions 14 (see FIG. 7) for a transistor.

Figure 2:
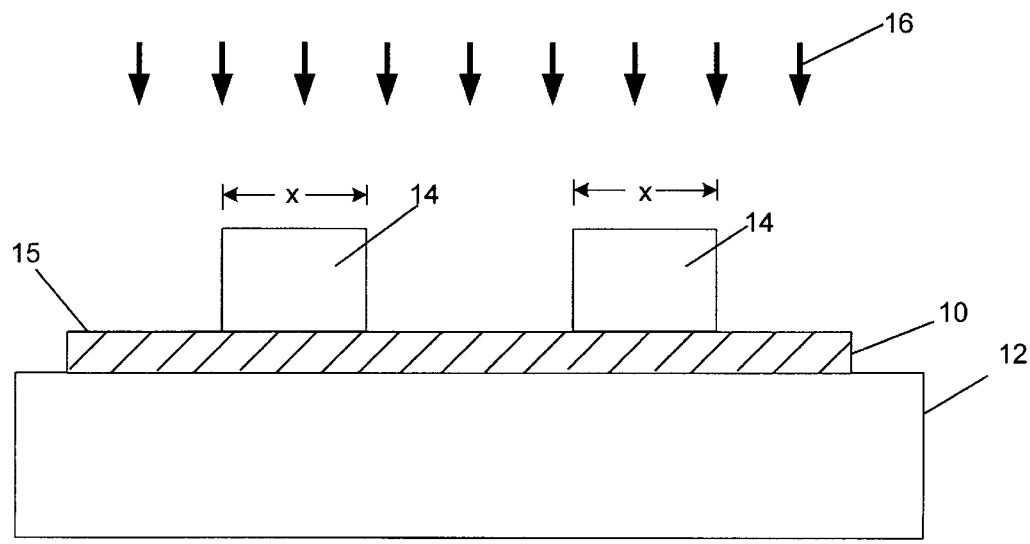
FIG. 2 is a cross-sectional view of the device shown in FIG. 1 after the uppermost process layer has been patterned.

Next, as shown in FIG. 2, the polysilicon layer 13 is patterned to define a plurality of source/drain regions 14. The polysilicon layer 13 may be patterned using a variety of known photolithography and etching techniques, such as, an anisotropic etching process using $SF_6$ as the etchant gas. The source/drain regions 14 have a width "X" which may be varied as a matter of design choice. For example, the width of each of the source/drain regions 14 may range from approximately 500–1500 Å.

Thereafter, as indicated by arrows 16, a dopant implantation process is performed to introduce dopant atoms into the source/drain regions 14. In one illustrative embodiment, the concentration of dopant atoms may range from approximately $3-9 \times 10^{15}$ ions/cm$^2$ of the appropriate dopant atoms, e.g., arsenic for NMOS technology or boron for PMOS technology. Of course, during this implantation process, the dielectric layer 10 acts as a barrier to prevent the dopant atoms from penetrating much beyond the surface 15 of the dielectric layer 10. The device is next subjected to a heating process to drive the dopant atoms throughout the source/drain regions 14. The heating process may be performed by a variety of known techniques. For example, the heating process may be a rapid thermal anneal (RTA) process performed at a temperature ranging from approximately 1050–1200° C. for a time ranging from approximately 60 seconds to 2 minutes. Alternatively, the heating process may be performed in a traditional tube furnace at a temperature ranging from approximately 1000–1150° C. for a time period ranging from approximately 30–90 minutes.

As will be recognized by one skilled in the art, the doping of the source/drain regions 14 may be accomplished by a variety of different techniques. For example, if desired, the appropriate dopant atoms may be added during the formation of the polysilicon layer 13, i.e., dopant atoms, such as arsenic, may be added during the deposition process used to form the polysilicon layer 13. Alternatively, an undoped polysilicon layer 13 may be formed and thereafter subjected to an ion implantation process and heating process before etching is performed to define the source/drain regions 14. As will be known to those skilled in the art, there are a variety of other techniques and methods for introducing dopant atoms into the portion of the polysilicon layer 13 that will ultimately become the source/drain regions 14. Thus, the particular technique used to accomplish this objective should not be considered a limitation of the present invention.

Figure 3:
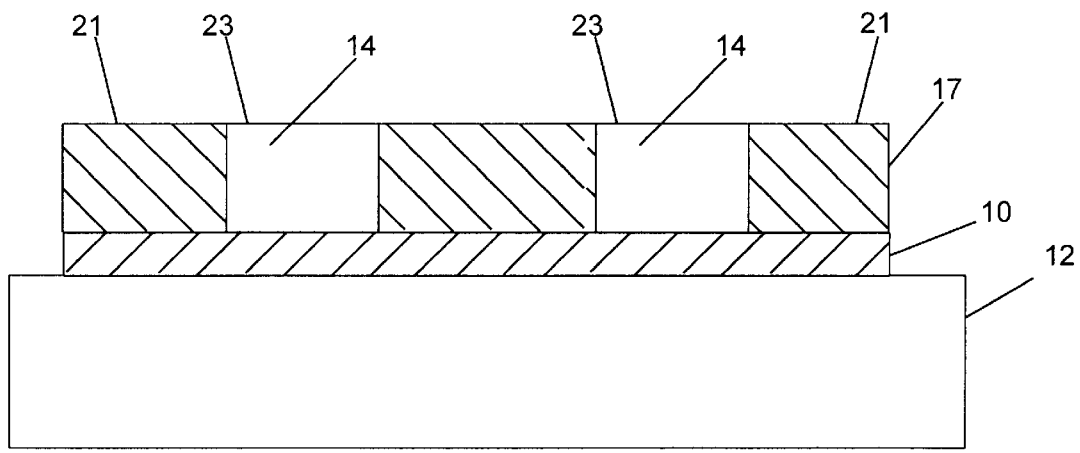
FIG. 3 is a cross-sectional view of the device shown in FIG. 2 after a third process layer has been formed thereabove.

Next, as shown in FIG. 3, a layer of dielectric material 17 is formed above the dielectric layer 10. The layer 17 may be comprised of a variety of dielectric materials, such as silicon dioxide, silicon oxynitride, silicon nitride, etc. Moreover, the layer 17 may be formed by a variety of different processes for forming such layers, including, but not limited to, CVD, LPCVD, etc. In one illustrative example of the present invention, the layer 17 is comprised of a layer of silicon dioxide formed by a CVD process. After the initial formation of the layer 17, a chemical mechanical polishing operation may be performed such that the surface 21 of the layer 17 is approximately even with the surface 23 of the source/drain regions 14.

Figure 4:
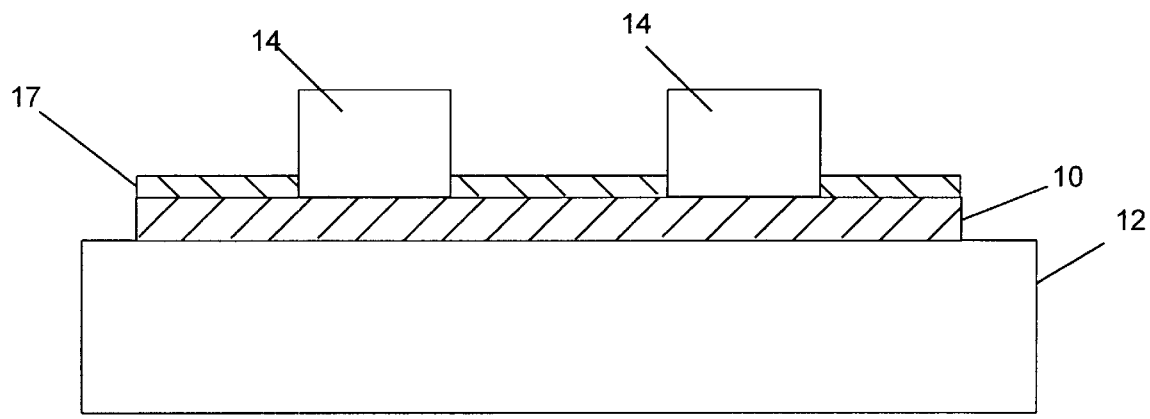
FIG. 4 is a cross-sectional view of the device shown in FIG. 3 after the thickness of the third process layer has been reduced.

Thereafter, as shown in FIG. 4, the thickness of the layer 17 may be reduced. In one embodiment, this reduction may be accomplished by an anisotropic etching process. Ultimately, the thickness of the layer 17 is reduced to a thickness ranging from approximately 50–800 Å. Alternatively, the layer 17 may be directly formed to its desired final thickness. This may be accomplished by a variety of known techniques, such as a CVD or LPCVD process.

Figure 5:
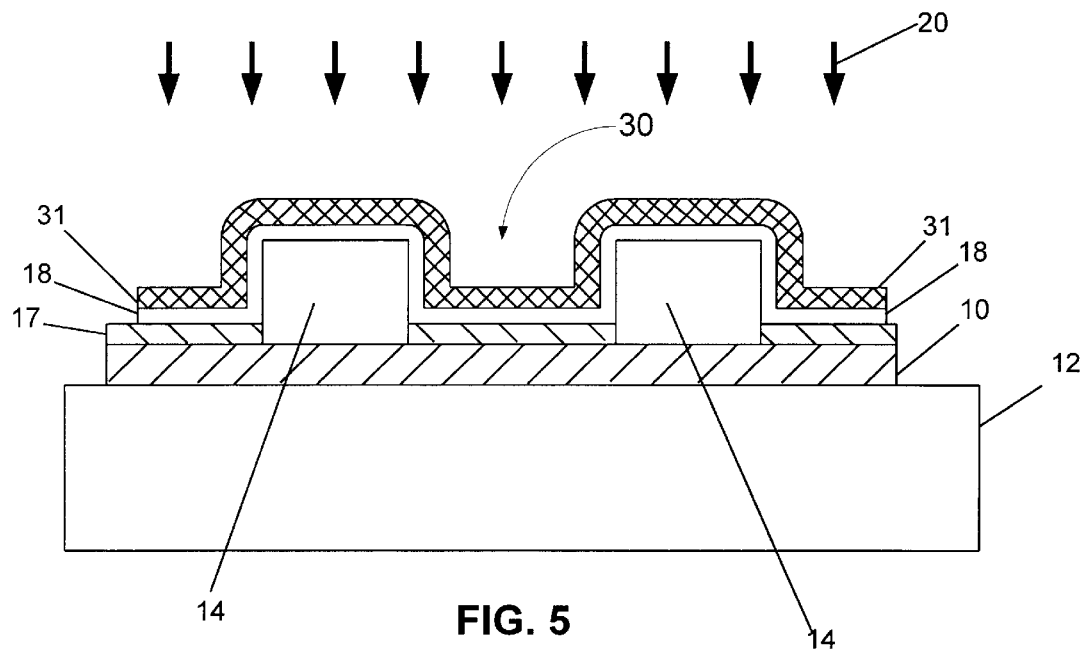
FIG. 5 is a cross-sectional view of the device shown in FIG. 4 after a plurality of additional process layers have been formed above the device.

Next, as shown in FIG. 5, a layer of polysilicon 18 is deposited above the dielectric layer 17 and the source/drain regions 14. The polysilicon layer 18 may be formed by a variety of known techniques, e.g., CVD, LPCVD, plasma deposition, etc., and may have a thickness ranging from approximately 150–400 Å. Thereafter, as indicated by the arrows 20, the device is subjected to a threshold voltage ion implantation process to introduce the appropriate dopant atoms into the layer 18. In one illustrative embodiment, for NMOS technology, this may be accomplished by an ion implantation process at a dopant concentration of approximately $2-8 \times 10^{12}$ ions/cm$^2$ of boron at an energy level ranging from approximately 5–20 keV.

Next, as shown in FIG. 5, a gate dielectric 30 for the transistor is formed above the polysilicon layer 18 between the source/drain regions 14. In one illustrative embodiment, the formation of the gate dielectric 30 is accomplished by thermally growing a process layer 31 comprised of silicon dioxide or a nitrogen-bearing silicon dioxide on the polysilicon layer 18. The gate dielectric 30 may be comprised of a variety of materials, such as silicon dioxide, a nitrogen-bearing silicon dioxide, or other dielectric materials, and the thickness of the gate dielectric 30 may be varied as a matter of design choice. Of course, the formation of the gate dielectric 30 may be accomplished by other techniques, such as a chemical vapor deposition process. In one illustrative embodiment, the gate dielectric 30 is comprised of thermally grown silicon dioxide having a thickness ranging from approximately 15–25 Å. Note that the thickness of the process layer 31 is greater in the area adjacent the source/drain regions 14 due to the previous N+ doping of those regions.

Figure 6:
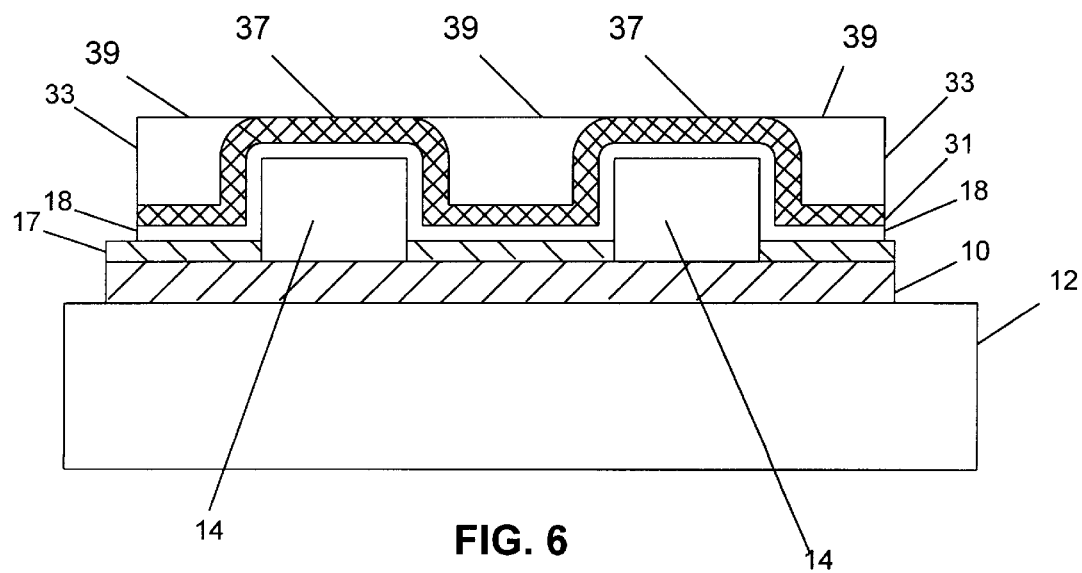
FIG. 6 is a cross-sectional view of the device shown in FIG. 5 after a layer of conductive material has been formed thereabove.

Next, as depicted in FIG. 6, a layer of conductive material 33 is formed. The conductive material 33 may be comprised of a variety of materials, such as a doped polysilicon, copper, aluminum, or other metals. After the layer of conductive material 33 is formed, a chemical mechanical polishing process may be performed such that a surface 39 of the layer of conductive material 33 is approximately even with a surface 37 of the process layer 31 above the source/drain regions 14.

Figure 7:
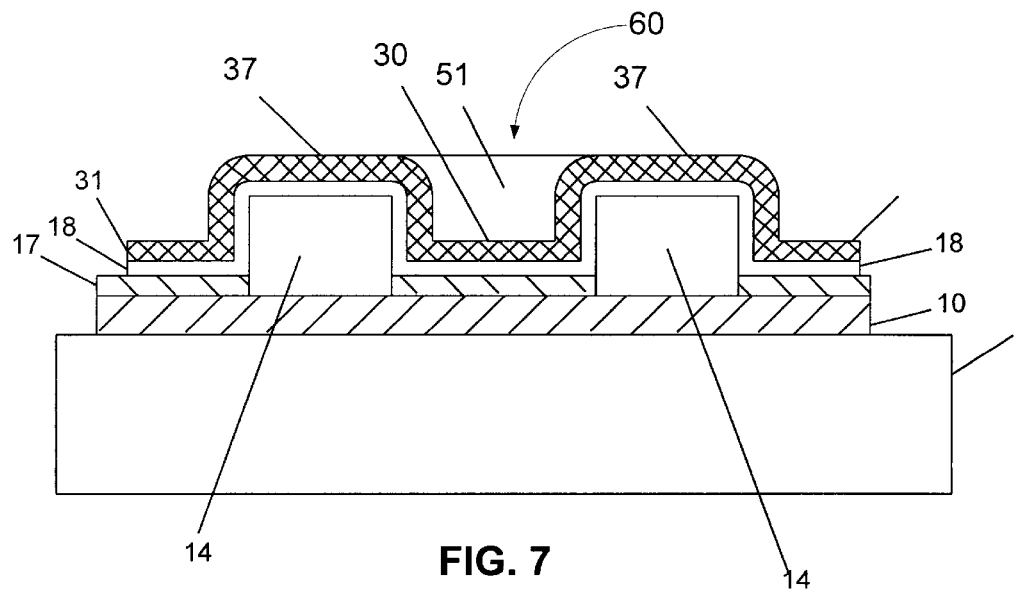
FIG. 7 is a cross-sectional view of one illustrative embodiment of a transistor in accordance with the present invention.

Thereafter, as shown in FIG. 7, portions of the conductive layer 33 are removed by traditional photolithography and etching processes to define a transistor 60. The transistor 60 is comprised of source/drain regions 14, a gate dielectric 30 and a gate conductor 51. Thereafter, using known techniques, appropriate conductive lines and plugs may be formed above the transistor 60. Note that portions of the process layer 31 act as an insulation structure to isolate the gate structure 51 from the source/drain regions 14.

Figure 8:
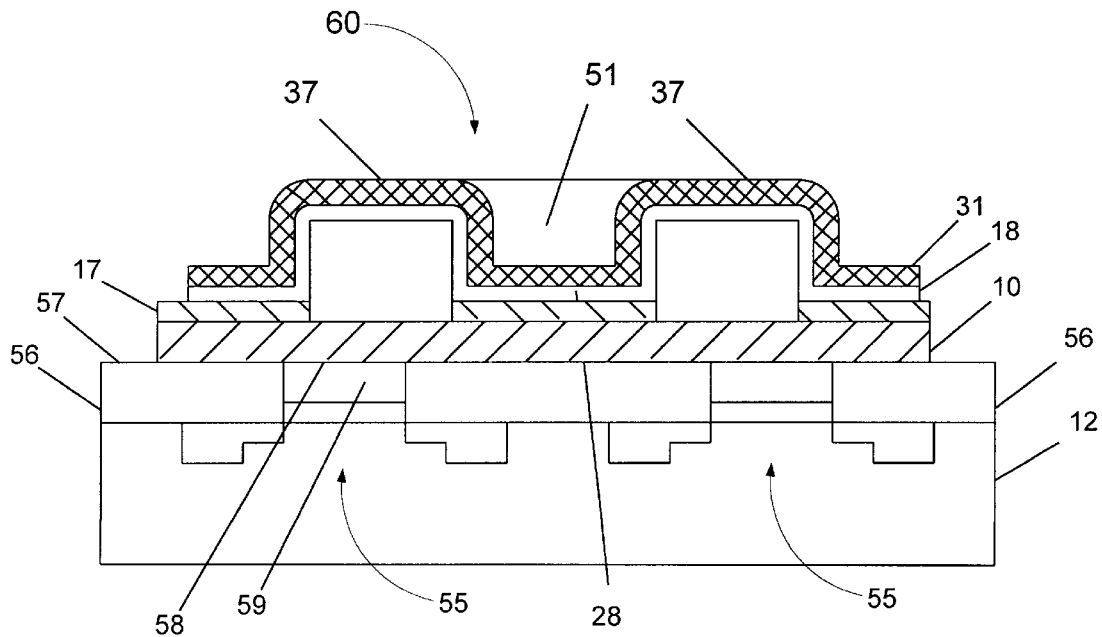
FIG. 8 is a cross-sectional view of one illustrative embodiment of the present invention that is formed above a plurality of pre-existing semiconductor devices.

As stated previously, the present invention may be used to form a plurality of transistors above other previously formed transistors, i.e., the present invention may be used to form multiple layers of transistors. For example, as shown in FIG. 8, a plurality of traditional semiconductor devices, e.g., transistors 55, may be formed above a structure 12 comprised of a silicon substrate using known techniques. Thereafter, a layer of appropriate dielectric material 56 may be formed above the plurality of transistors 57. For example, the dielectric layer 56 may be comprised of silicon dioxide, silicon oxynitride, PSG, BPSG, or other like materials.

Next, if desired, a surface 57 of the layer 56 may be planarized using a traditional chemical mechanical polishing technique. Thereafter, using the inventive method disclosed herein, a process layer 10 comprised of a dielectric material is formed above the layer 56, and the additional processes disclosed herein to form an illustrative transistor 60 are performed. As shown in FIG. 8, this illustrative embodiment results in the formation of multiple layers of transistors above a semiconducting substrate. Alternatively, the layer 56 may be formed of a sufficient thickness such that the surface 57 of the layer 56 extends above the surface 58 of the gate conductor 59 of the transistors 60. Using this alternative technique, depending upon the particular application under consideration, the formation of the process layer 10 may not be required. That is, using the techniques disclosed herein, the transistors 60 may be formed directly above the surface 57 of the dielectric layer 56.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
    forming a first layer of dielectric material;
    forming a first layer of polysilicon above said first layer of dielectric material;
    patterning said first layer of polysilicon to define a plurality of source/drain regions;
    forming a second layer of dielectric material at least above said first layer of dielectric material;
    forming a second layer of polysilicon at least between said source/drain regions and above said second layer of dielectric material;
    forming a gate dielectric above said second layer of polysilicon; and
    forming a gate conductor above said gate dielectric.

2. The method of claim 1, wherein forming a first layer of dielectric material comprises forming a layer of dielectric material above a semiconducting substrate comprised of silicon.

3. The method of claim 1, wherein forming a first layer of dielectric material comprises forming a layer of dielectric material above a plurality of previously formed semiconductor devices.

4. The method of claim 1, further comprising introducing dopant atoms into at least said source/drain regions.

5. The method of claim 4, wherein introducing dopant atoms into at least said source/drain regions comprises performing an ion implantation process after said source/drain regions have been defined.

6. The method of claim 4, wherein introducing dopant atoms into at least said source/drain regions comprises introducing dopant atoms into the first layer of polysilicon at the time the first layer of polysilicon is formed.

7. The method of claim 1, wherein forming a first layer of dielectric material comprises forming a layer of dielectric material comprised of silicon dioxide, a nitrogen-bearing silicon dioxide, or silicon oxynitride.

8. The method of claim 1, wherein forming a first layer of dielectric material comprises forming a first layer of dielectric material having a dielectric constant less than approximately eight.

9. The method of claim 1, wherein forming a first layer of polysilicon above said first layer of dielectric material comprises depositing a first layer of polysilicon above said first layer of dielectric material.

10. The method of claim 1, wherein patterning said first layer of polysilicon to define a plurality of source/drain regions comprises etching said first layer of polysilicon to define a plurality of source/drain regions.

11. The method of claim 1, wherein forming a second layer of dielectric material at least above said first layer of dielectric material comprises:
    forming a second layer of a dielectric material to an initial thickness; and
    reducing the initial thickness of said second layer of dielectric material to a final desired thickness.

12. The method of claim 1, wherein forming a second layer of dielectric material at least above said first layer of dielectric material comprises:
    depositing a second layer of a dielectric material to an initial thickness; and etching the second layer of dielectric material to a final desired thickness.

13. The method of claim 1, wherein forming a second layer of dielectric material at least above said first layer of dielectric material comprises forming a second layer of a dielectric material to a final desired thickness.

14. The method of claim 1, wherein forming a second layer of polysilicon at least between said source/drain regions and above said second layer of dielectric material comprises depositing a second layer of polysilicon at least between said source/drain regions and above said second layer of dielectric material.

15. The method of claim 1, wherein forming a gate dielectric above said second layer of polysilicon comprises thermally growing a gate dielectric above said second layer of polysilicon.

16. The method of claim 1, wherein forming a gate dielectric above said second layer of polysilicon comprises depositing a gate dielectric above said second layer of polysilicon.

17. The method of claim 15, wherein forming a gate dielectric above said second layer of polysilicon comprises thermally growing a gate dielectric comprised of silicon dioxide or a nitrogen-bearing silicon dioxide above said second layer of polysilicon.

18. The method of claim 16, wherein forming a gate dielectric above said second layer of polysilicon comprises depositing a gate dielectric comprised of silicon dioxide, a nitrogen-bearing silicon dioxide, silicon nitride, or silicon oxynitride above said second layer of polysilicon.

19. The method of claim 1, wherein forming a gate dielectric above said second layer of polysilicon comprises forming a gate dielectric comprised of silicon dioxide, a nitrogen-bearing silicon dioxide, silicon nitride, or silicon oxynitride above said second layer of polysilicon.

20. The method of claim 1, wherein forming a gate conductor above said gate dielectric comprises forming a gate conductor comprised of a doped polysilicon, copper or aluminum above said gate dielectric.

21. The method of claim 1, wherein forming a gate conductor above said gate dielectric comprises depositing a layer of a conductive material at least between said source/drain regions.

22. A method of forming a transistor, comprising:
   forming a first layer of dielectric material;
   depositing a first layer of polysilicon above said first layer of dielectric material;
   etching said first layer of polysilicon to define a plurality of source/drain regions;
   forming a second layer of dielectric material at least above said first layer of dielectric material;
   depositing a second layer of polysilicon at least between said source/drain regions and above said second layer of dielectric material;
   forming a gate dielectric above said second layer of polysilicon between said source/drain regions; and
   forming a gate conductor above said gate dielectric.

23. The method of claim 22, wherein forming a first layer of dielectric material comprises forming a first layer of dielectric material above a semiconducting substrate comprised of silicon.

24. The method of claim 22, wherein forming a first layer of dielectric material comprises forming a first layer of dielectric material above a plurality of previously formed semiconductor devices.

25. The method of claim 22, further comprising introducing dopant atoms into at least said source/drain regions.

26. The method of claim 25, wherein introducing dopant atoms into at least said source/drain regions comprises performing an ion implantation process after said source/drain regions have been defined.

27. The method of claim 25, wherein introducing dopant atoms into at least said source/drain regions comprises introducing dopant atoms into the first layer of polysilicon at the time the first layer of polysilicon is formed.

28. The method of claim 22, wherein forming a first layer of dielectric material comprises forming a first layer of dielectric material comprised of silicon dioxide, a nitrogen-bearing silicon dioxide, or silicon oxynitride.

29. The method of claim 22, wherein forming a first layer of dielectric material comprises forming a layer of dielectric material having a dielectric constant less than approximately eight.

30. The method of claim 22, wherein forming a second layer of dielectric material at least above said first layer of dielectric material comprises:
   forming a second layer of a dielectric material to an initial thickness; and
   reducing the initial thickness of said second layer of dielectric material to a final desired thickness.

31. The method of claim 22, wherein forming a second layer of dielectric material at least above said first layer of dielectric material comprises:
   depositing a second layer of a dielectric material to an initial thickness; and
   etching the second layer of dielectric material to a final desired thickness.

32. The method of claim 22, wherein forming a second layer of dielectric material at least above said first layer of dielectric material comprises forming a second layer of a dielectric material to a final desired thickness.

33. The method of claim 22, wherein forming a gate dielectric above said second layer of polysilicon comprises thermally growing a gate dielectric above said second layer of polysilicon.

34. The method of claim 22, wherein forming a gate dielectric above said second layer of polysilicon comprises depositing a gate dielectric above said second layer of polysilicon.

35. The method of claim 33, wherein forming a gate dielectric above said second layer of polysilicon comprises thermally growing a gate dielectric comprised of silicon dioxide or a nitrogen-bearing silicon dioxide above said second layer of polysilicon.

36. The method of claim 34, wherein forming a gate dielectric above said second layer of polysilicon comprises depositing a gate dielectric comprised of silicon dioxide, a nitrogen-bearing silicon dioxide, silicon nitride, or silicon oxynitride above said second layer of polysilicon.

37. The method of claim 22, wherein forming a gate dielectric above said second layer of polysilicon comprises forming a gate dielectric comprised of silicon dioxide, a nitrogen-bearing silicon dioxide, silicon nitride, or silicon oxynitride above said second layer of polysilicon.

38. The method of claim 22, wherein forming a gate conductor above said gate dielectric comprises forming a gate conductor comprised of a doped polysilicon, copper or aluminum above said gate dielectric.

39. The method of claim 22, wherein forming a gate conductor above said gate dielectric comprises depositing a layer of a conductive material at least between said source/drain regions.

* * * * *